United States Patent
Nakashiba (10) Patent No.: US 6,563,541 B1
(45) Date of Patent: May 13, 2003

(54) SOLID STATE IMAGE DEVICE WITH A VERTICAL CHARGE TRANSFER PORTION

(75) Inventor: Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/108,175

(22) Filed: Jul. 1, 1998

(30) Foreign Application Priority Data

Jul. 1, 1997 (JP) .............................. 9-176017

(51) Int. Cl.$^7$ .......................... H04N 3/14; H04N 5/335
(52) U.S. Cl. .................................. 348/324; 257/223
(58) Field of Search ........................... 348/315, 324, 348/311, 317, 322; 257/242, 286, 232, 223, 231, 249, 233

(56) References Cited

U.S. PATENT DOCUMENTS

| | | | |
|---|---|---|---|
| 4,680,637 A | * 7/1987 | Sugiki ......................... | 348/311 |
| 5,422,503 A | * 6/1995 | Cazaux et al. ................ | 257/249 |
| 5,965,910 A | * 10/1999 | Wood .......................... | 257/231 |

FOREIGN PATENT DOCUMENTS

| | | |
|---|---|---|
| JP | 57-42163 | 3/1982 |
| JP | 62245665 A | * 10/1987 |
| JP | 8-88344 | 4/1996 |
| JP | 08-130684 | 5/1996 |
| JP | 10065143 A | * 8/1996 |
| JP | 8-260657 | 10/1996 |

* cited by examiner

*Primary Examiner*—Wendy R. Garber
*Assistant Examiner*—Jason Whipkey
(74) *Attorney, Agent, or Firm*—Sughrue Mion, PLLC (57) ABSTRACT

In a solid state image device, a group of optical-electrical conversion portions are arranged in a vertical direction. Further, at least one vertical charge transfer portion is arranged adjacent to the optical-electrical conversion portions and transfer the electrical charge signal in the vertical direction. Moreover, at least one parallel charges transfer portion is connected to the vertical charge transfer portion at one end and transfer the electrical charge signal in a parallel direction. On this condition, a plurality of charge transfer electrodes each constitute the vertical charge transfer portion. In this event, the charge transfer electrodes include a final charge transfer electrode coupled to the parallel charge transfer portion at the one end. With such a structure, a first electrode length of the final charge transfer electrode is shorter than the other electrode lengths of the remaining charge transfer electrodes.

15 Claims, 7 Drawing Sheets

SOLID STATE IMAGE DEVICE WITH A VERTICAL CHARGE TRANSFER PORTION

BACKGROUND OF THE INVENTION

This invention relates to a solid state image device which has a vertical charge transfer portion and a parallel charge transfer portion, and in particular, to a connection portion therebetween.

A solid state image device of the type described has been recently used in an image device, such as a video camera and an electrical camera. In this device, an inputted optical signal is converted into an electrical charge signal. The converted electrical charge signal is transferred to an output portion via charge transfer portions.

More specifically, the above conventional solid state image device mainly includes a plurality of vertical charge transfer portions, a plurality of photo-electrical conversion portions, and a parallel charge transfer portion, as disclosed in Japanese Unexamined Patent Publications Nos. Hei. 8-260657 and Hei. 8-88344.

Herein, the photoelectrical conversion portions are arranged adjacent to each of the vertical charge transfer portions. Further, the parallel charge transfer portion is electrically connected to the vertical charge conversion portion at least one end side. Moreover, the parallel charge transfer portion is connected to an output circuit portion.

With such a structure, a plurality of charge transfer electrodes are arranged at each of the vertical charge transfer portions. In this event, the vertical charge transfer portions are connected to the parallel charge transfer portion via a final charge transfer electrode at the one end side.

With this structure, each length of the charge transfer electrodes is generally identical to each other to keep charge transfer efficiency and charge transfer capacitance in the conventional solid state image device.

In consequence, when a charge transfer duration from the vertical charge transfer portion to the parallel charge transfer portion is short, or when a charge transfer rate from the vertical charge transfer portion to the parallel charge transfer portion is slow, an output signal difference often takes place between the adjacent vertical lines. This is because a signal charge which is left in the connection portion between the vertical charge transfer portion and the parallel charge transfer portion is transferred into the parallel charge transfer portion at the subsequent timing at which the parallel charge transfer portion starts to transfer the charge. In particular, when the output signal is low, an abnormality with respect to a vertical line shape, which is generally called a black line defect, often brings about.

Further, under the above-mentioned condition, a part of the signal charge is inevitably left in the vertical charge transfer portion. In particular, when the output signal is low, the charge transfer efficiency is remarkably degraded.

SUMMARY OF THE INVENTION

It is therefore an object of this invention to provide a solid state image device which is capable of reducing remaining signal charge at a connection portion between a vertical charge transfer portion and a parallel charge transfer portion.

It is another object of this invention to provide a solid state image device which is capable of suppressing a black line defect and preventing deterioration of charge transfer efficiency.

A solid state image device according to this invention, a group of optical-electrical conversion portions are arranged in a vertical direction. In this event, each of the optical-electrical conversion portions converts an optical signal into an electrical charge signal.

Further, at least one vertical charge transfer portion is arranged adjacent to the optical-electrical conversion portions and transfer the electrical charge signal in the vertical direction.

Moreover, at least one parallel charges transfer portion is connected to the vertical charge transfer portion at one end and transfer the electrical charge signal in a parallel direction.

On this condition, a plurality of charge transfer electrodes constitute the vertical charge transfer portion. In this event, the charge transfer electrodes include a final charge transfer electrode coupled to said parallel charge transfer portion at the one end.

With such a structure, a first electrode length of the final charge transfer electrode is shorter than the other electrode lengths of the remaining charge transfer electrodes.

Consequently, the charge transfer distance from the vertical charge transfer portion to the parallel charge transfer portion becomes shorter than that in the conventional solid state image device.

Further, the charge transfer rate from the vertical charge transfer portion to the parallel charge transfer portion can be made quicker as compared to the conventional solid state image device because the fringe electrical field, which is the exponential function of the charge transfer distance, can be increased.

In consequence, no signal charge is left at the connection portion between the vertical charge transfer portion and the parallel charge transfer portion.

Moreover, even when the output signal is relatively low, the abnormality, such as the black line defect, can be effectively suppressed.

DESCRIPTION OF PREFERRED EMBODIMENT

Referring to FIGS. 1 through 4, a conventional solid state image device will be first described for a better understanding of this invention. The solid state image device is equivalent to the conventional solid state image device mentioned in the preamble of the instant specification.

Figure 1:
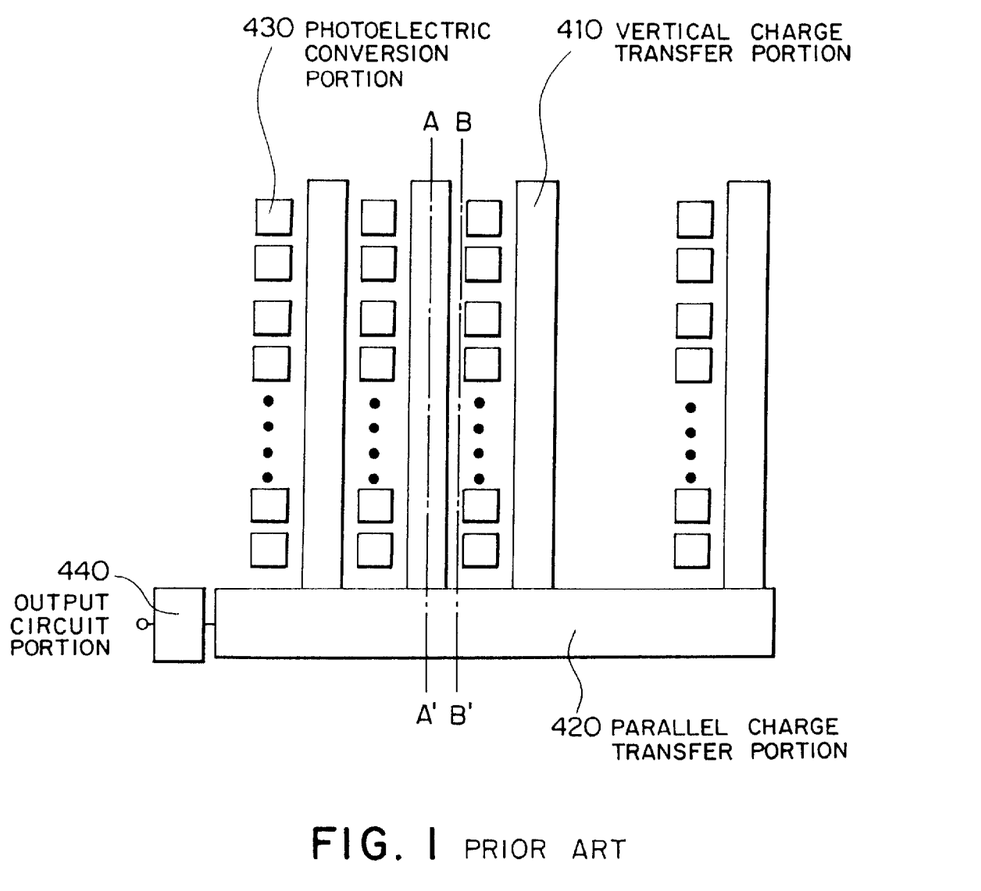
FIG. 1 is a schematic view showing a conventional solid state image device of an inter-line transfer type.

As shown in FIG. 1, the conventional solid state image device mainly includes a plurality of vertical charge transfer portions 410, a plurality of photoelectrical conversion portions 430, and a parallel charge transfer portion 420. Herein, the photoelectrical conversion portions 430 are arranged adjacent to each of the vertical charge transfer portions 410. Further, the parallel charge transfer portion 420 is electrically connected to the vertical charge conversion portions 410 at one end side.

In this event, the parallel charge transfer portion 420 is connected to an output circuit portion 440.

Figures 2A, 2B:
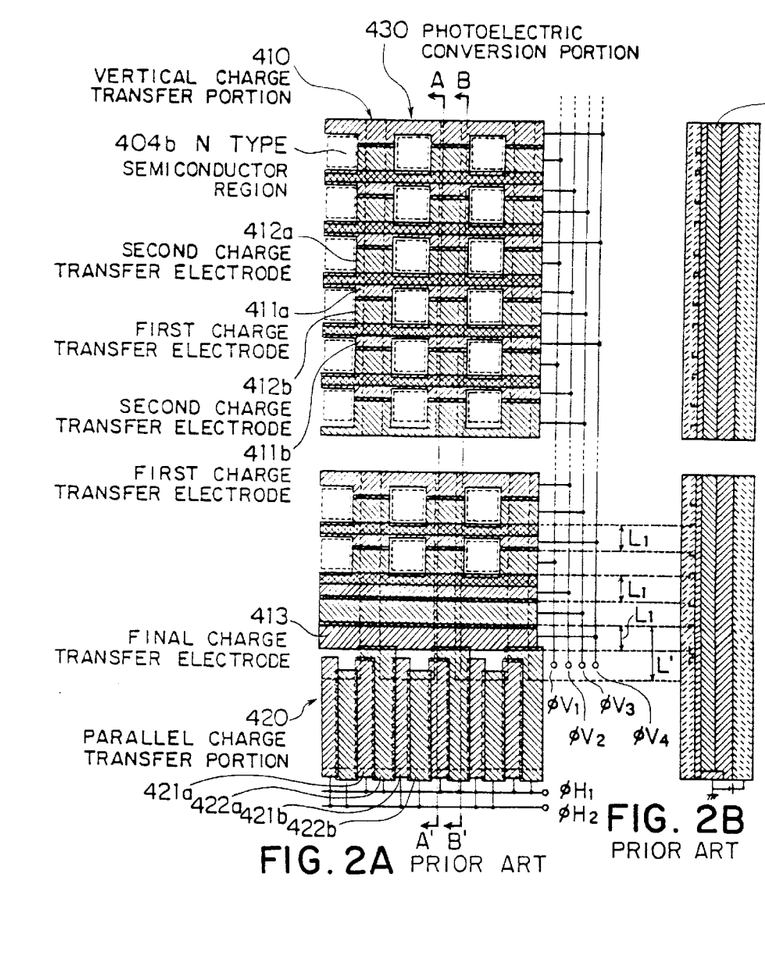
FIG. 2A is a plan view showing a connection portion between a vertical charge transfer portion and a parallel charge transfer portion in the conventional solid state image device.
FIG. 2B is a cross sectional view, taken along A–A' line in FIG. 2A.
Figure 2C:
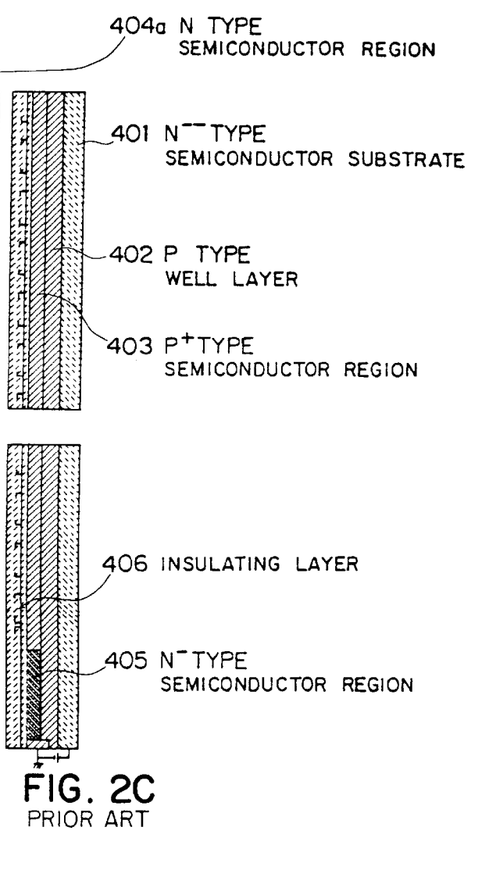
FIG. 2C is a cross sectional view, taken along B–B' line in FIG. 2A.

In FIGS. 2A through 2C, the reference numeral 401 denotes an $N^{--}$ type semiconductor substrate, the reference numeral 402 denotes a P type well, the reference numeral 403 denotes a $P^+$ type semiconductor region, the reference numerals 404a and 404b denote N type semiconductor regions.

Further, the reference numeral 405 denotes an $N^-$ type semiconductor region, and the reference numeral 406 denotes an insulating film.

Moreover, the reference numeral 410 denotes a vertical charge transfer portion, the reference numerals 411a and 411b denote first charge transfer electrodes of the vertical charge transfer portion 410, the reference numerals 412a and 412b denote second charge transfer portion of the vertical charge transfer portion 410, and the reference numeral 413 denotes a final charge transfer electrode of the vertical charge transfer portion 410.

In addition, the reference numeral 420 denotes a parallel charge transfer portion, the reference numerals 421a and 421b denote first charge transfer electrodes of the parallel charge transfer portion 420, the reference numerals 422a and 422b denote second charge transfer electrodes of the parallel charge transfer portion 420, the reference numeral 430 denotes a photo-electrical conversion portion, and the reference numeral 440 denotes an output circuit.

As illustrated in FIGS. 2B and 2C, the P type well 402 having impurity concentration of about $1E16\ cm^{-3}$ is formed on the $N^{--}$ type semiconductor substrate 401 having the impurity concentration of about $5E14\ cm^{-3}$. Further, on the P type well 402, a $P^+$ type semiconductor region 403, an N type semiconductor region 404a, an N type semiconductor region 404b and an $N^-$ type semiconductor region 405 are formed.

Herein, the $p^+$ type semiconductor region has the impurity region of about $1E18\ cm^{-3}$ and becomes a device separation region.

Further, the N type semiconductor region 404a has the impurity concentration of about $1E17\ cm^{-3}$ and becomes a charge storage regions of the vertical charge transfer portion 410 and the parallel charge transfer portion 420.

Moreover, the N type semiconductor region 404b has the impurity concentration of about $5E16\ cm^{-3}$ and becomes the photoelectrical conversion portion 430. In addition, the $N^-$ semiconductor region 405 has the impurity region of about $8E16\ cm^{-3}$ and becomes a charge barrier region against the parallel charge transfer portion 420.

Further, the first charge transfer electrodes 411a and 411b, the second charge transfer electrodes 412a and 412b and the final charge transfer electrode 413 of the vertical charge transfer portion 410 are arranged on the $N^{--}$ semiconductor substrate 401 via the insulating film 406. Herein, these electrodes are formed by the use of double layers of polysilicon films and are driven by applying charge transfer pulses ΦV1, ΦV2, ΦV3 and ΦV4, respectively.

Moreover, the first charge transfer electrodes 421a, 421b and the second charge transfer electrodes 422a, 422b of the parallel charge transfer portion 420 are arranged in the parallel charge transfer portion 420 and are driven by applying charge transfer pulses ΦH1 and ΦH2.

As illustrated in FIGS. 3A through 3D and FIG. 4, signal charges e1 and e2 in the vertical charge transfer portion 410 are stored below the first and second transfer electrodes 411a and 411b which are given a high voltage $V_{VH}$ at the timing t1. Herein, a high voltage $V_{HH}$ is applied to the first and second charge transfer electrodes 421a and 422a of the parallel charge transfer portion 420.

Figure 3A:
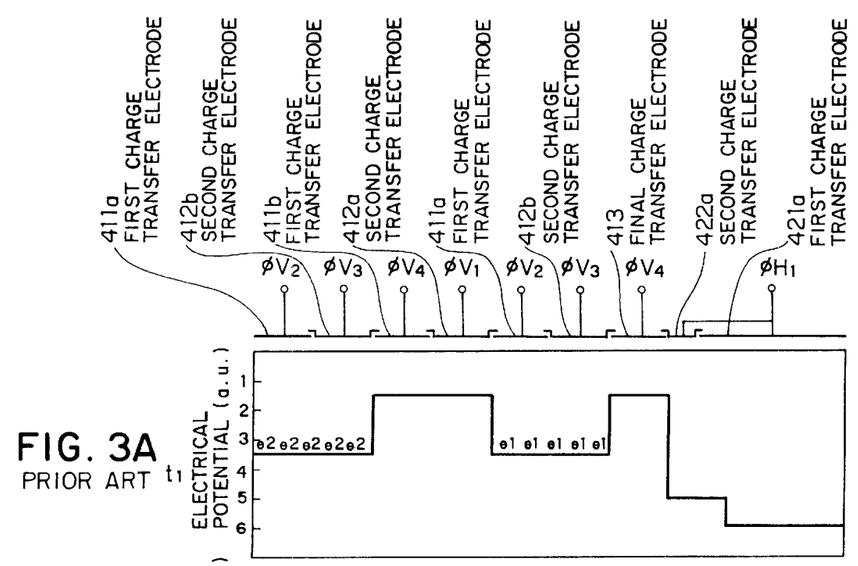
FIGS. 3A through 3D show electrical potential for explaining an charge transfer operation from a vertical charge transfer portion to a parallel charge transfer portion in the conventional solid image device.
Figure 3B:
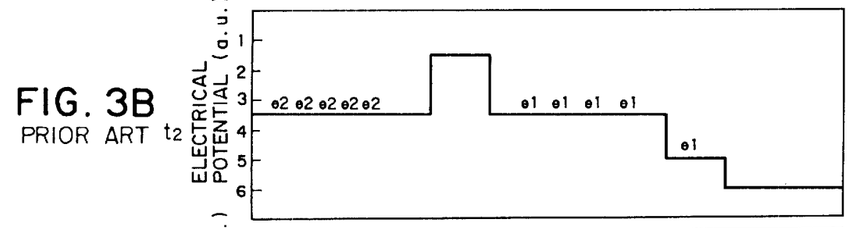
Figure 4:
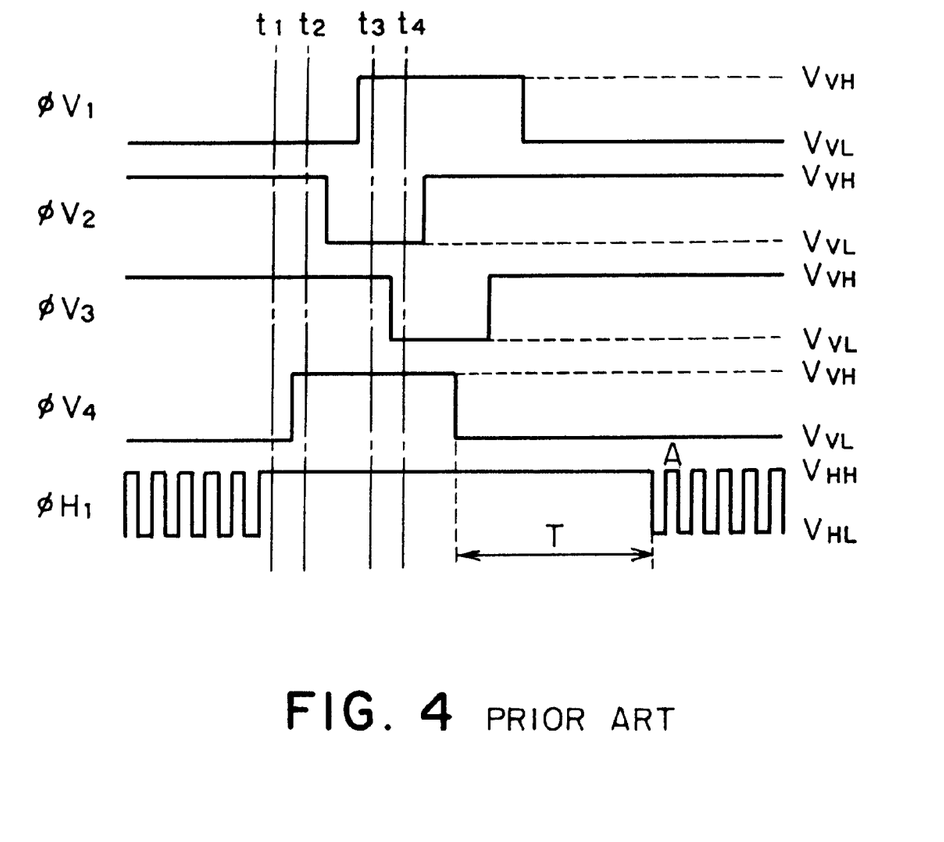
FIG. 4 is a timing chart showing clock pulses which are applied to a vertical charge transfer portion and a parallel charge transfer portion.

Subsequently, the high voltage ΦV4 is applied to the final charge transfer electrode 413 and the first charge transfer electrode 411b of the vertical charge transfer portion 410 which are given a clock pulse ΦV4 at the timing t2.

Thereby, the parallel charge transfer portion 420 is conducted with the vertical charge transfer portion 410. Consequently, the signal charge e1 starts to transfer towards a charge storage region which is formed below the first charge transfer electrode 421a of the parallel transfer portion 420 via the second charge transfer electrode 421a of the parallel charge transfer portion 420 which is applied the high voltage $V_{HH}$ in accordance with electrical potential vibration below the final charge transfer electrode 413. Low voltage $V_{HL}$ is the low voltage reference for ΦH1 as illustrated in FIG. 4.

In this event, the subsequent signal charge e2 is stored below the first and second charge transfer electrodes 411a, 411b and 412b which are applied the high voltage $V_{HH}$.

Figure 3C:
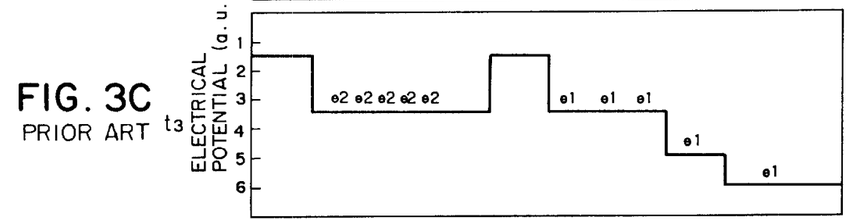

Subsequently, at the timing t3, the low voltage $V_{VL}$ is applied to the first charge transfer electrode 411a of the vertical charge transfer portion 410 which is given the clock pulse ΦV2.

Successively, the high voltage $V_{VH}$ is applied to the second charge transfer electrode 412 of the vertical charges transfer portion 410 which is given the clockΦV1.

In consequence, the signal electrode e1 continues to be transferred towards the first charge transfer electrode 421a of the parallel charge transfer portion 420 via the second charge transfer electrode 422a which is given the high voltage $V_{HH}$ in accordance with the electrical potential variation.

In this event, the subsequent signal charge e2 is stored below the first and second charge transfer electrodes 411b, 412a, and 412b which are given the high voltage $V_{HH}$ of the vertical charge transfer portion 410.

Figure 3D:
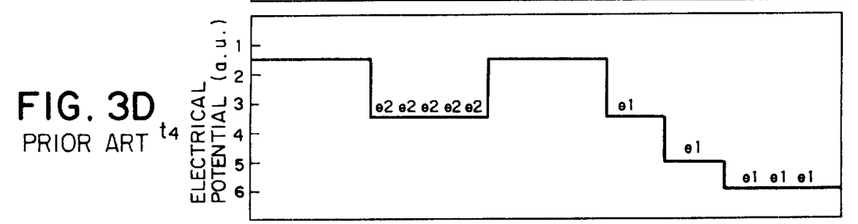

Successively, at the timing t4, the low voltage $V_{VL}$ is applied to the first charge transfer electrode 412b of the vertical charge transfer portion 410 which is given the clock pulse ΦV3. Thereby, the signal charge e1 continues be transferred towards the first charge transfer electrode 421a of the parallel charge transfer portion 420 via the second charge transfer portion 421a which is given the high voltage $V_{HH}$ in accordance with the electrical potential variation. In this event, the subsequent signal charge e2 is stored below the first and second charge transfer electrodes 411b and 412a which are given the high voltage $V_{HH}$ of the vertical charge transfer portion 410.

Finally, the high voltage $V_{VH}$ is applied to the first charge transfer portion 411a of the vertical charge transfer portion 410 which is given the clock pulse ΦV2 and the low voltage $V_{VH}$ is applied to the first charge transfer electrode 411b and the final charge transfer electrode 413 of the vertical charge transfer portion 410 which are the clock pulseΦV4. Further, the high voltage $V_{VH}$ is applied to the first charge transfer electrode 412b of the vertical charge transferring portion 410 which is given the clock pulse V3.

Successively, the low voltage $V_{VL}$ is applied to the second charge transfer electrode 412a of the vertical charge transfer portion 410 which is given the clock pulse ΦV1.

Thereby, the charge transfer operation for one scan line is completed from the vertical charge transfer portion 410 to the parallel charge transfer portion 420. Thereafter, the state returns to the initial state at the timing t1.

By repeating the above operation, the signal charges are transferred from the vertical charge transfer portion 410 into the parallel charge transfer portion 420.

As mentioned before, first charge transfers electrodes 411a, 411b and second charges transfer electrodes 412a, 412b are arranged at the vertical charge transfer portion 410. In this event, the vertical charge transfer portions 410 are connected to the parallel charge transfer portion 420 via the final charge transfer electrode 413 at the one end side, as shown in FIG. 2A.

However, each length (L1) of all the first and second charge transfer electrodes 411,412, and 413 of the vertical charge transfer portion 410 is identical to each other to keep an charge transfer efficiency and a charge transfer capacitance in the above conventional solid state image device.

Alternatively, the electrode length (L1) of the first charge transfer electrode 411 which is formed by the conductive material of the same layer is the same with the electrode length (L1) of the second charge transfer electrode 412.

Consequently, when a charge transfer duration (T in FIG. 4) from the vertical charge transfer portion 410 to the parallel charge transfer portion 420 is short, or when a charge transfer rate from the vertical charge transfer portion 410 to the parallel charge transfer portion 420 is slow, an output signal difference takes place between the adjacent vertical lines. This is because a signal charge which is left in the connection portion between the vertical charge transfer portion 410 and the parallel charge transfer portion 420 is transferred into the parallel charge transfer portion at the subsequent timing (A in FIG. 4) at which the parallel charge transfer portion starts to transfer the charge.

In particular, when the output signal is low, an abnormality of a vertical line shape, which is generally called a black line defect, often brings about.

Further, under the same above-mentioned condition, a part of the signal charge is left in the vertical charge transfer portion 410. In particular, when the output signal is low, the charge transfer efficiency is remarkably degraded.

Taking the above-mentioned problems into consideration, this invention provides a solid state image device which is capable of reducing remaining signal charge at a connection portion between a vertical charge transfer portion and a parallel charge transfer portion.

Subsequently, description will be made about a solid state image device according to an embodiment of this invention, referring to FIG. 5.

Figure 5A:
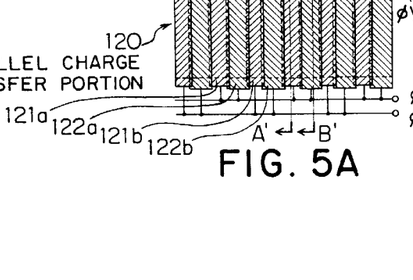
FIG. 5A is a plan view showing a connection portion between a vertical charge transfer portion and a parallel charge transfer portion according to a solid state image device of this invention.
Figure 5B:
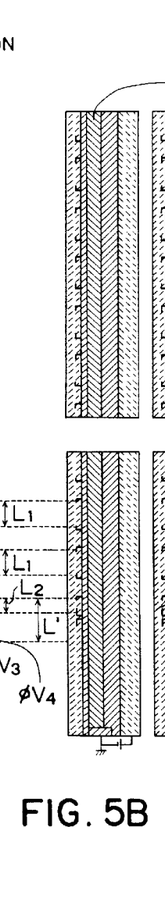
FIG. 5B is a cross sectional view, taken along A–A' line in FIG. 5A.
Figure 5C:
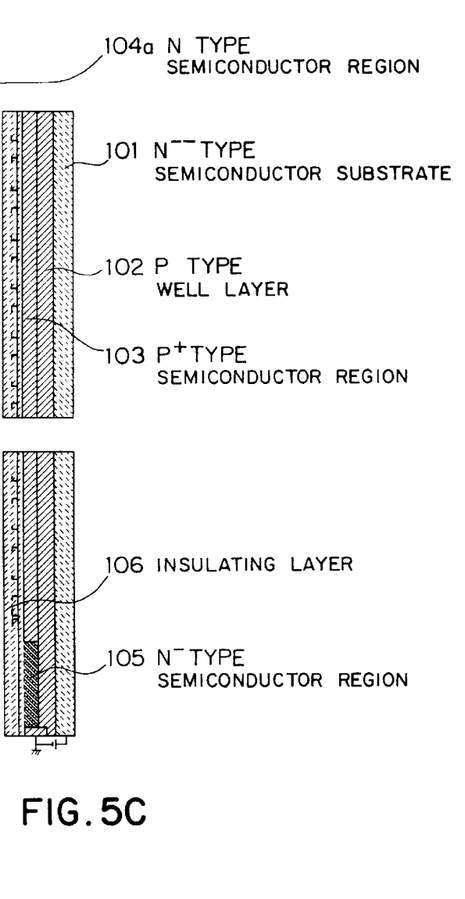
FIG. 5C is a cross sectional view, taken along B–B' line in FIG. 5A.
Figure 6A:
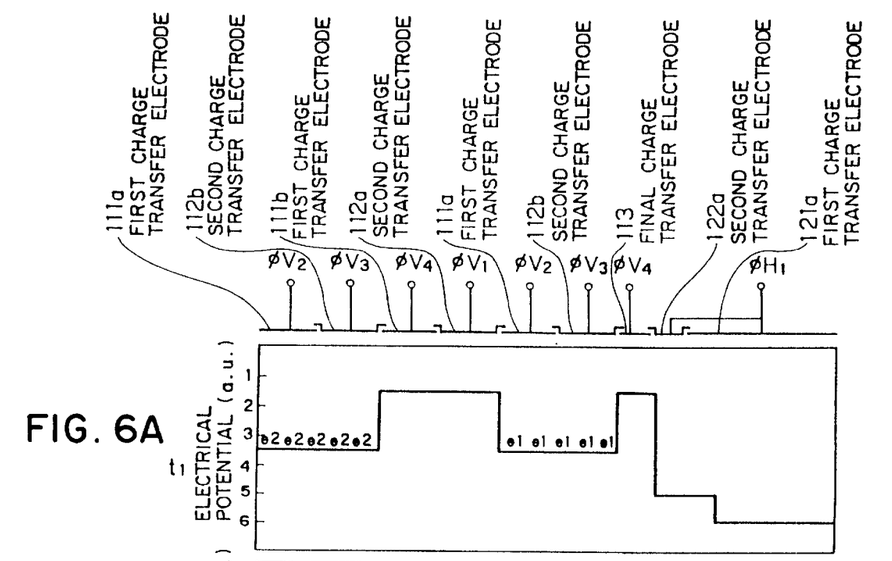
FIGS. 6A through 6D show electric potential for explaining an charge transfer operation from a vertical charge transfer portion to a parallel charge transfer portion according to a solid image device of this invention.
Figure 6B:
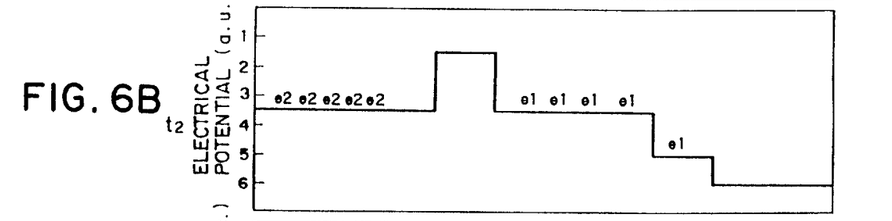
Figure 6C:
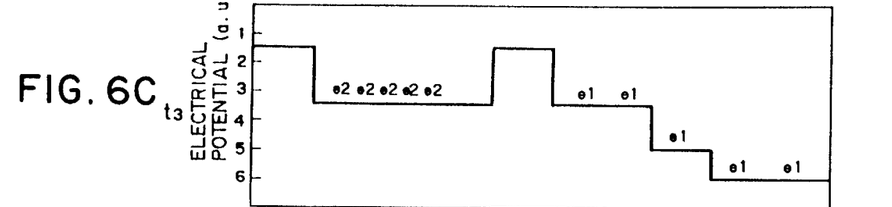
Figure 6D:
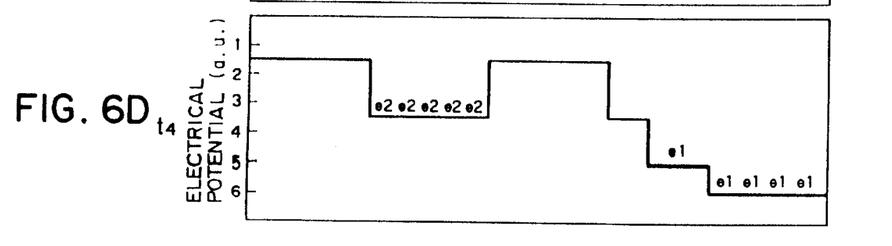

In FIGS. 5A through 5C, the reference numeral 101 denotes an $N^{--}$ type semiconductor substrate, the reference numeral 102 denotes a P type well, the reference numeral 103 denotes a $P^+$ type semiconductor region, and the reference numerals 104a and 104b denote N type semiconductor regions.

Further, the reference numeral 105 denotes an $N^-$ type semiconductor region, the reference numeral 106 denotes an insulating film, the reference numeral 110 denotes a vertical charge transfer portion, the reference numerals 111a and 111b denote first charge transfer electrodes of the vertical charge transfer portion 110, the reference numerals 112a and 112b denote second charge transfer portion of the vertical charge transfer portion 110, and the reference numeral 113 denotes a final charge transfer electrode of the vertical charge transfer portion 110.

Moreover, the reference numeral 120 denotes a parallel charge transfer portion, the reference numerals 121a and 121b denote first charge transfer electrodes of the parallel charge transfer portion 120, the reference numerals 122a and 122b denote second charge transfer electrodes of the parallel charge transfer portion 120, and the reference numeral 130 denotes a photo-electric conversion portion.

The solid state image device illustrated in FIG. 5A is similar to the conventional solid state image device illustrated in FIG. 2A except that the electrode length (L2) of the final charge transfer electrode 113 of the vertical charge transfer portion 110 is shorter than the electrode length (L1) of the first charge transfer electrodes 111a and 111b.

Consequently, the charge transfer distance between the vertical charge transfer portion 110 and the parallel charge transfer portion 120 can be shortened as compared to the conventional solid state image device illustrated in FIG. 2.

Further, a fringe electrical field, which is an exponential function of the charge transfer distance (L'), is increased. As a result, the charge transfer rate from the vertical charge transfer portion 110 to the parallel charge transfer portion 120 can be made quicker.

As illustrated in FIGS. 6A through 6D, the charge transfer operation is carried out by the use of the clock pulses in FIG. 4 in the same manner with the conventional solid state image device.

It is confirmed that from FIG. 6A through FIG. 6D, the charge transfer rate from the vertical charge transfer portion 110 to the parallel charge transfer portion 120 becomes quicker as compared to the operation (illustrated in FIGS. 3A through 3D) of the conventional solid state image device.

In the conventional solid state device, a large voltage is applied to the first and second charge transfer electrodes 421a and 422a of the parallel charge transfer portion 420 to improve the charge transfer rate from the vertical charge transfer portion 410 to the parallel charge transfer portion 420. Thereby, the fringe electrical field is increased, and the charge transfer rate from the vertical charge transfer portion 410 to the parallel charge transfer portion 420 is also increased.

However, although the charge transfer remaining quantity is reduced at a certain degree in the conventional solid state image device, it is impossible to completely eliminate it.

In contrast, it is easy to transfer the charge into the parallel charge transfer portion in the solid state image device according to this invention because the final charge transfer portion 113 is shorter as compared to the conventional solid state image device illustrated in FIG. 2A. In consequence, there is no charge transfer remaining quantity below the final charge transfer portion.

In the solid state image device according to this invention, the electrode length (L2) of the final charge transfer electrode 113 is selected shorter (L2=0.8L1) than the electrode length (L1) of the final charge transfer electrode 4 in the conventional solid state image device.

Consequently, the charge transfer distance L' from the vertical charge transfer portion 110 to the parallel charge transfer portion 120 can be made shorter than the charge transfer distance (L) of the charge transfer portion in the conventional solid state image device.

Further, the charge transfer rate from the vertical charge transfer portion 110 to the parallel charge transfer portion 120 can be made quicker because the fringe electrical field, which is the exponential function of the charge transfer distance, can be increased.

Figure 7:
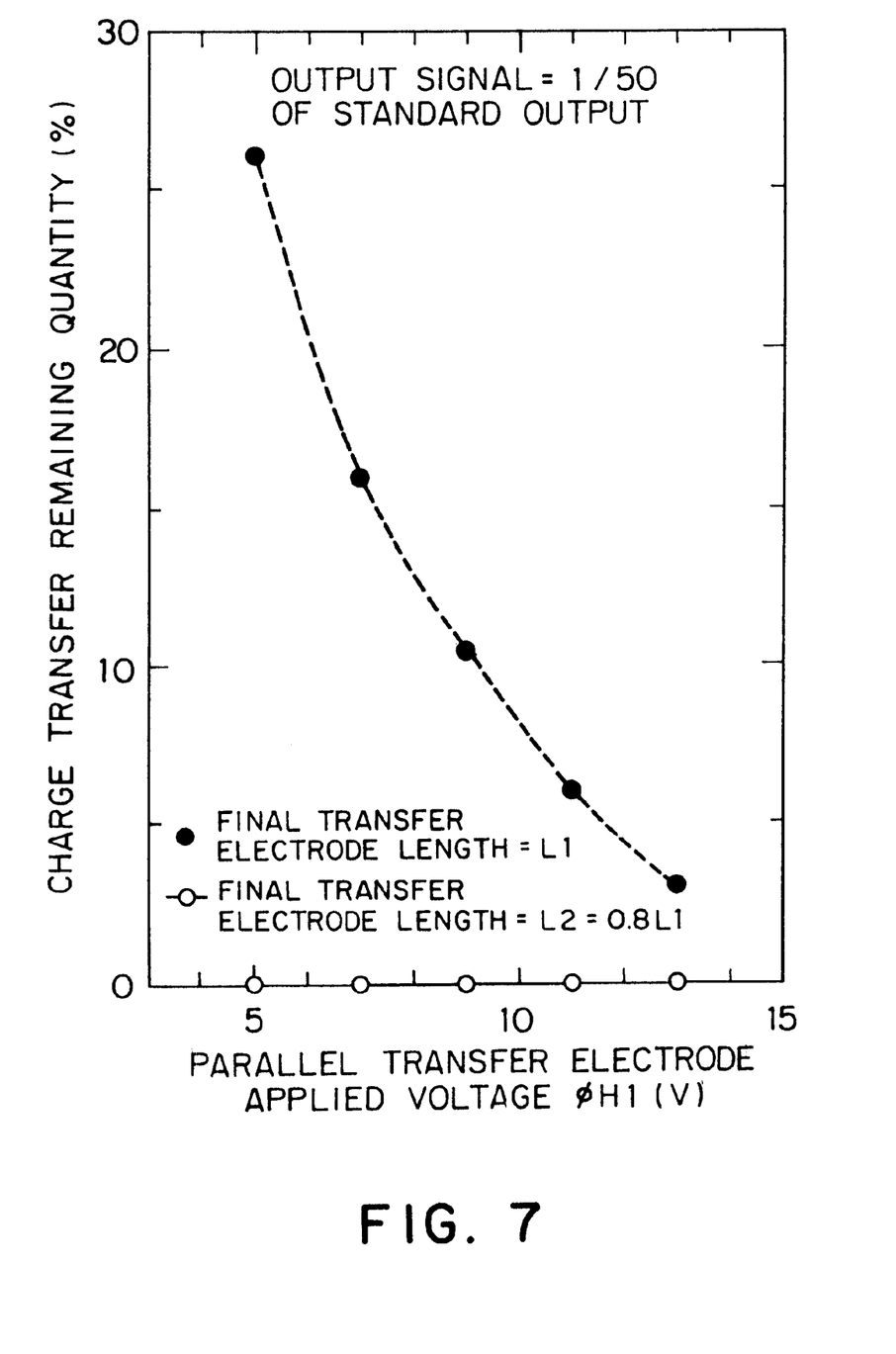
FIG. 7 is a graph showing a relation between a parallel transfer electrode applied voltage and a charge transfer remaining quantity as an experimental result with respect to a solid state image device.

As illustrated in FIG. 7, it is confirmed that there is no remaining transfer signal charge when the voltage of 5V or higher is applied to the first and the second charge transfer electrodes 121a and 122a of the parallel charge transfer portion 120, as indicated by white circles in FIG. 7.

In consequence, no signal charge is left at the connection portion between the vertical charge transfer portion 110 and the parallel charge transfer portion 120. Further, even when the output signal is relatively low, the occurrence of the abnormality of the vertical line, which is called the black defect, can be effectively suppressed.

When the electrode length (L2) of the final charge transfer electrode 113 is shorter, the charge transfer rate from the vertical charge transfer portion 110 to the parallel charge transfer portion 120 becomes quicker. However, when the potential modulation due to the short channel effect takes place for the final charge transfer electrode 113 on the condition that the low voltage $V_{VL}$ is applied to the final charge transfer electrode 113 and the high voltages $V_{VH}$ and $V_{HH}$ are applied to the second charge transfer electrode 112b of the adjacent vertical charge transfer portion 110 and the first and second charge transfer electrodes 121a and 122a of the parallel charge transfer portion 120, the maximum charge transfer capacitance of the vertical charge transfer portion 110 is restricted by the above potential.

Therefore, it is desirable to select the electrode length (L2) of the final charge transfer electrode 113 in the range specified by the following formula when the P type well has the concentration of about 1E16 cm$^{-3}$, the N type well has the concentration of about 1E17 cm$^{-3}$, and the gate insulating film has the film thickness of 75 nm.

$$1.8 \ \mu m \leq L2(=0.8L1) < L1$$

Although description has been made about the solid state image device which is formed by the double layer polysilicon and which has the first and second charge transfer electrodes in the above-mentioned embodiment, this invention can be also applied to the solid state image device which has the charge transfer electrode of a single layer.

Alternatively, this invention may also be applied to the solid state image device which has three or more of the charge transfer electrodes.

Further, although description has been made about the solid state image device which has the parallel charge transfer portion which is electrically coupled to the one end side of a group of the vertical charge transfer portions, this invention may be applied to the other type of solid state image device, such as the flame transfer type which has the parallel charge transfer portion which is electrically coupled to the one end side of a group of the vertical charge transfer portions.

What is claimed:

1. A solid state image device, comprising:

a group of optical-electrical conversion portions each of which converts an optical signal into an electrical charge signal and which are arranged in a vertical direction;

at least one vertical charge transfer portion which is arranged adjacent to said optical-electrical conversion portions and which transfer the electrical charge signal in the vertical direction;

at least one parallel charge transfer portion which is connected to said vertical charge transfer portion at one end side and which transfer the electrical charge signal in a parallel direction; and a plurality of charge transfer electrodes which constitutes said vertical charge transfer portion and which include a final charge transfer electrode coupled to said parallel charge transfer portion at the one end;

a first electrode length of said final charge transfer electrode being shorter than the other electrode lengths of the remaining charge transfer electrodes.

2. A device as claimed in claim 1, further comprising:

an output portion which is connected to said parallel charge transfer portion and which produces the electrical charge signal.

3. A device as claimed in claim 1, wherein;

said vertical charge transfer portion is arranged at a plurality of positions so as to be connected with said parallel charge transfer portion at the one end.

4. A device as claimed in claim 1, wherein;

said parallel charge transfer portion is arranged at an opposite end against the one end so that said parallel charge transfer portion is connected to said vertical charge transfer portion at the opposite end.

5. A device as claimed in claim 1, wherein:

said vertical charge transfer portion has a final charge transfer portion which corresponds to the final charge transfer electrode, the final charge transfer portion has a charge transfer remaining quantity, and the first electrode length is shorter than the other electrode lengths in order to reduce the charge transfer remaining quantity.

6. A device as claimed in claim 1, further comprising:

an electrode length L1 of the first charge transfer electrode; and an electrode length L2 of the final charge transfer electrode;

wherein said L2 is a value less than 1.8 micrometers and L2 is equal to 0.8×L1.

7. A solid state image device, comprising:

a group of optical-electrical conversion portions each of which converts an optical signal into an electrical charge signal and which are arranged in a vertical direction;

at least one vertical charge transfer portion which is arranged adjacent to said optical-electrical conversion portions and which transfer the electrical charge signal in the vertical direction;

at least one parallel charge transfer portion which is connected to said vertical charge transfer portion at least one end; and a charge transfer connection portion which is placed between said vertical charge transfer portion and said parallel charge transfer portion;

said charge transfer connection portion has a first charge transfer distance L1; a second charge transfer distance L2, and a charge transfer remaining quantity, wherein said first charge transfer distance L1 and said second charge transfer distance L2 are selected so as to eliminate the charge transfer remaining quantity;

wherein said L2 is a value less than 1.8 micrometers and L2 is equal to 0.8×L1.

8. A solid state image device for use in avoiding a black line defect by arranging at least one vertical charge transfer portion for transferring electrical charge signals in a vertical direction and a plurality of charge transfer electrodes coupled to said vertical charge transfer portion, wherein:

said charge transfer electrodes have at least two charge transfer distances comprising:
a first charge transfer distance L1;
a second charge transfer distance L2,
and a charge transfer remaining quantity;
wherein said charge transfer electrodes includes a final charge transfer electrode corresponding to said second charge transfer distance L2, and each of the remaining charge transfer electrodes, corresponding to said first charge transfer distance L1, are selected so as to eliminate the charge transfer remaining quantity in order to prevent the black line defect related to the electrical charge signals by changing a length of the final charge transfer electrode corresponding to said second charge transfer distance L2 from the length of each of the remaining charge transfer electrodes corresponding to the first charge transfer distance L1.

9. A device as claimed in claim 8, wherein said L2 is a value less than 1.8 micrometers and L2 is equal to 0.8×L1.

10. A solid state image device, comprising:

a group of optical-electrical conversion portions each of which converts an optical signal into an electrical charge signal and which are arranged in a vertical direction;

at least one vertical charge transfer portion which is arranged adjacent to said optical-electrical conversion portions and which transfer the electrical charge signal in the vertical direction, and which is composed of a plurality of layers;

at least one parallel charge transfer portion which is connected to said vertical charge transfer portion at one end side and which transfer the electrical charge signal in a parallel direction; and a plurality of charge transfer electrodes which constitute said vertical charge transfer portion and which include a final charge transfer electrode coupled to said parallel charge transfer portion at the one end;

a first electrode length of said final charge transfer electrode being shorter than the other electrode lengths of the remaining charge transfer electrodes which have the same layer as said final charge transfer electrode.

11. A device as claimed in claim 10, further comprising:

an output portion which is connected to said parallel charge transfer portion and which produces the electrical charge signal.

12. A device as claimed in claim 10, wherein;

said vertical charge transfer portion is arranged at a plurality of positions so as to be connected with said parallel charge transfer portion at the one end.

13. A device as claimed in claim 10, wherein;

said parallel charge transfer portion is arranged at an opposite end against the one end so that said parallel charge transfer portion is connected to said vertical charge transfer portion at the opposite end.

14. A device as claimed in claim 10, wherein:

said vertical charge transfer portion has a final charge transfer portion which corresponds to the final charge transfer electrode, the final charge transfer portion has a charge transfer remaining quantity, and the first electrode length is shorter than the other electrode lengths in order to reduce the charge transfer remaining quantity.

15. A device as claimed in claim 10, further comprising:

an electrode length L1 of the first charge transfer electrode; and an electrode length L2 of the final charge transfer electrode;

wherein said L2 is a value less than 1.8 micrometers and L2 is equal to 0.8×L1.

* * * * *